United States Patent
Arimai et al.

(10) Patent No.: US 11,411,344 B2
(45) Date of Patent: Aug. 9, 2022

(54) ELECTRONIC DEVICE UNIT

(71) Applicants: Mitsubishi Electric Corporation, Tokyo (JP); Nippon Tanshi Co., Ltd., Kanagawa (JP)

(72) Inventors: Fumiaki Arimai, Tokyo (JP); Hiroyoshi Nishizaki, Tokyo (JP); Shinya Enomoto, Kanagawa (JP); Osamu Nishimura, Kanagawa (JP); Masaru Fujino, Kanagawa (JP)

(73) Assignees: Mitsubishi Electric Corporation, Tokyo (JP); NIPPON TANSHI CO., LTD., Kanagawa (JP)

( * ) Notice: Subject to any disclaimer, the term of this patent is extended or adjusted under 35 U.S.C. 154(b) by 145 days.

(21) Appl. No.: 16/901,267

(22) Filed: Jun. 15, 2020

(65) Prior Publication Data
US 2021/0066844 A1 Mar. 4, 2021

(30) Foreign Application Priority Data
Sep. 4, 2019 (JP) .............................. JP2019-160877

(51) Int. Cl.
*H01R 13/514* (2006.01)
*H05K 5/00* (2006.01)
(Continued)

(52) U.S. Cl.
CPC ......... *H01R 13/514* (2013.01); *H05K 5/0069* (2013.01); *H05K 5/0247* (2013.01)

(58) Field of Classification Search
CPC .. H01R 13/514; H01R 13/665; H01R 31/065; H01R 12/72; H01R 12/728;
(Continued)

(56) References Cited

U.S. PATENT DOCUMENTS

| 6,442,027 B2 * | 8/2002 | Sanada .............. H05K 7/20854 361/704 |
| 2001/0009505 A1 | 7/2001 | Nishizawa et al. |

(Continued)

FOREIGN PATENT DOCUMENTS

| CN | 205029143 U | 2/2016 |
| CN | 105564302 A | 5/2016 |

(Continued)

OTHER PUBLICATIONS

Communication dated Nov. 24, 2020, from the Japanese Patent Office in Application No. 2019-160877.
(Continued)

*Primary Examiner* — Hoa C Nguyen
*Assistant Examiner* — Amol H Patel
(74) *Attorney, Agent, or Firm* — Sughrue Mion, PLLC; Richard C. Turner

(57) ABSTRACT

The electronic device unit includes: a control target device; and an electronic control device, the control target device including: a control target housing; a control target component; and an inner connector, the electronic control device including: an electronic circuit including a circuit board and an electronic control component; and a first connector, which is electrically connected to the electronic control component. The control target housing has formed therein an opening, which allows the electronic control device to be placed in and taken out of the control target housing. When the first connector is connected to the inner connector, the electronic control device is located inside the control target housing.

6 Claims, 5 Drawing Sheets

(51) Int. Cl.
*H05K 5/06* (2006.01)
*H01R 31/06* (2006.01)
*H01R 12/72* (2011.01)
*H01R 13/66* (2006.01)
*H05K 5/02* (2006.01)

(58) Field of Classification Search
CPC .... H05K 5/0069; H05K 5/0247; H05K 5/069; H05K 5/065; H05K 5/0026; H05K 5/0034
See application file for complete search history.

(56) References Cited

U.S. PATENT DOCUMENTS

| | | | |
|---|---|---|---|
| 2005/0052851 A1 | 3/2005 | Yamada et al. | |
| 2010/0177483 A1* | 7/2010 | Yoshimoto | H05K 7/1417 361/714 |
| 2011/0205706 A1* | 8/2011 | Higashi | B60R 16/0239 361/699 |
| 2020/0305295 A1* | 9/2020 | Healey | H05K 5/064 |
| 2020/0408594 A1* | 12/2020 | Omote | H05K 1/0277 |

FOREIGN PATENT DOCUMENTS

| | | |
|---|---|---|
| JP | 10-54369 A | 2/1998 |
| JP | 2001209773 A | 8/2001 |
| JP | 2003-272754 A | 9/2003 |
| JP | 200585089 A | 3/2005 |
| JP | 5459090 B2 | 4/2014 |

OTHER PUBLICATIONS

Communication dated Oct. 21, 2021, issued by the National Intellectual Property Office of the P.R.C. in application No. 202010862859.9.

* cited by examiner

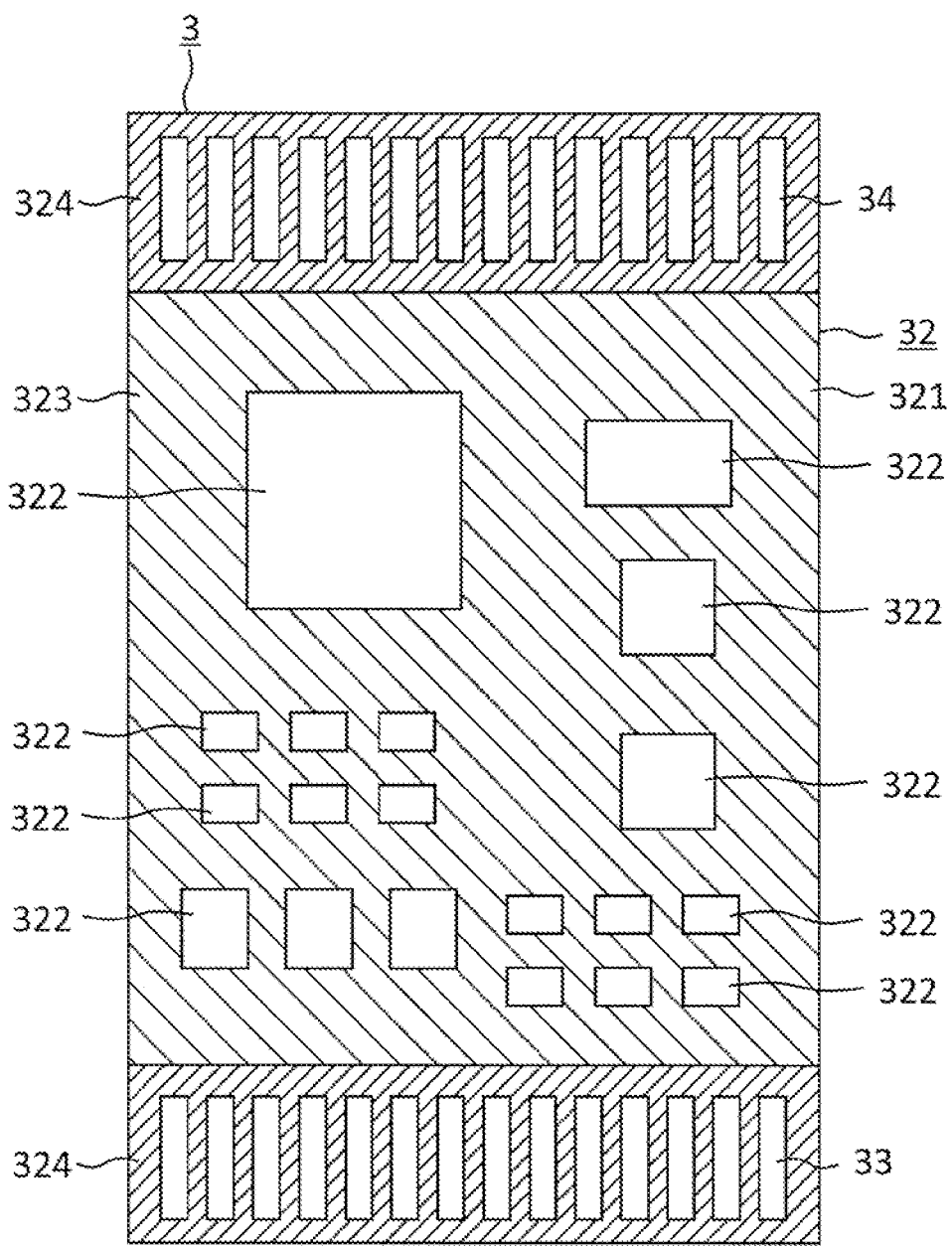

ELECTRONIC DEVICE UNIT

BACKGROUND OF THE INVENTION

1. Field of the Invention

The present invention relates to an electronic device unit.

2. Description of the Related Art

Hitherto, there has been known an electronic control device to be mounted to a control target device, which includes an electronic circuit including a circuit board and electronic components, a first connector fixed to the circuit board and electrically connected to the electronic components, and a second connector fixed to the circuit board and electrically connected to the electronic components. The control target device includes a control target housing, a control target component provided inside the control target housing and controlled by the electronic control device, and an inner connector provided inside the control target housing and electrically connected to the control target component. When the electronic control device is mounted to the control target device, the first connector is connected to the inner connector, the electronic circuit is located inside the control target housing, and the second connector is connected to an outer connector provided outside the control target housing. The electronic circuit is located inside the control target housing, and hence a space required to provide the electronic circuit is saved in an outer region of the control target housing (see, for example, Japanese Patent Application Laid-open No. 2003-272754).

SUMMARY OF THE INVENTION

However, the electronic control device is fixed to an inner wall of the control target housing when being mounted to the control target device. Thus, at the time of replacement of the electronic control device mounted to the control target device, it is required to disassemble the control target housing. This leads to a problem of a troublesome operation for replacement of the electronic control device mounted to the control target device.

The present invention has been made to solve the problem described above, and has an object to provide an electronic device unit which can save a space required to provide an electronic circuit in an outer region of a control target housing, and which also allows an electronic control device mounted to a control target device to be easily replaced.

According to at least one embodiment of the present invention, there is provided an electronic device unit including: a control target device; and an electronic control device to be mounted to the control target device, the control target device including: a control target housing; a control target component provided inside the control target housing; and an inner connector, which is provided inside the control target housing, and is electrically connected to the control target component, the electronic control device including: an electronic circuit including a circuit board and an electronic control component mounted to the circuit board; and a first connector, which is fixed to the circuit board, and is electrically connected to the electronic control component. In the electronic device unit, the control target housing has formed therein an opening, which allows the electronic control device to be placed in and taken out of the control target housing, and when the first connector is connected to the inner connector, at least a part of the electronic control device is located inside the control target housing.

According to the at least one embodiment of the present invention, it is possible to provide the electronic device unit which can save the space required to provide the electronic circuit in the outer region of the control target housing, and which also allows the electronic control device mounted to the control target device to be easily replaced.

BRIEF DESCRIPTION OF THE DRAWINGS

FIG. 5 is a plan view of the electronic control device of FIG. 3, from which a resin portion is removed.

DESCRIPTION OF THE EMBODIMENTS

Figure 1:
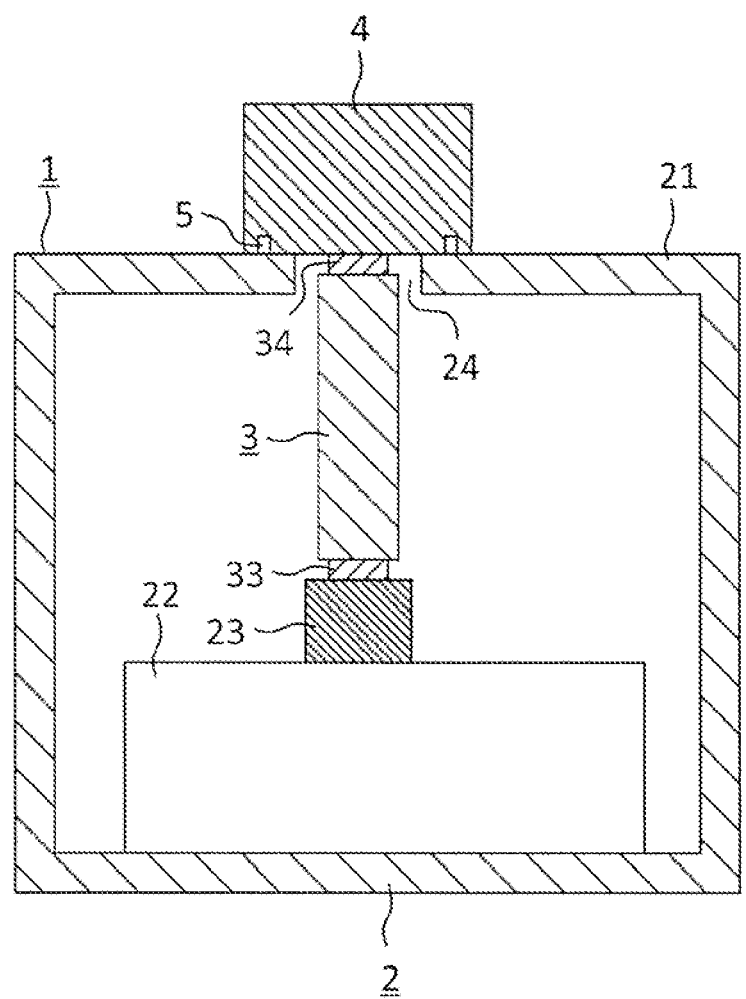
FIG. 1 is a sectional view of an electronic device unit according to a first embodiment of the present invention.

With reference to the drawings, embodiments of the present invention are described below. In the drawings, identical or equivalent components are denoted by identical reference numerals.

First Embodiment

FIG. 1 is a sectional view of an electronic device unit according to a first embodiment of the present invention. The electronic device unit 1 includes a control target device 2, and an electronic control device 3 to be mounted to the control target device 2.

The control target device 2 includes a control target housing 21, a control target component 22 provided inside the control target housing 21, and an inner connector 23 provided inside the control target housing 21 and electrically connected to the control target component 22. The inner connector 23 is fixed to the control target component 22. Through a reduction of a distance between the control target component 22 and the inner connector 23, a bus bar or harness for connecting between the control target component 22 and the inner connector 23 is shortened. With this, a manufacturing cost of the electronic device unit 1 is saved.

The control target housing 21 has an opening 24 formed in an upper wall thereof. The control target component 22 is placed on a lower wall of the control target housing 21. The inner connector 23 is provided on an upper surface of the control target component 22. Further, the inner connector 23 is provided so as to overlap with the opening 24 as viewed from above. The inner connector 23 is a female connector.

Figure 2:
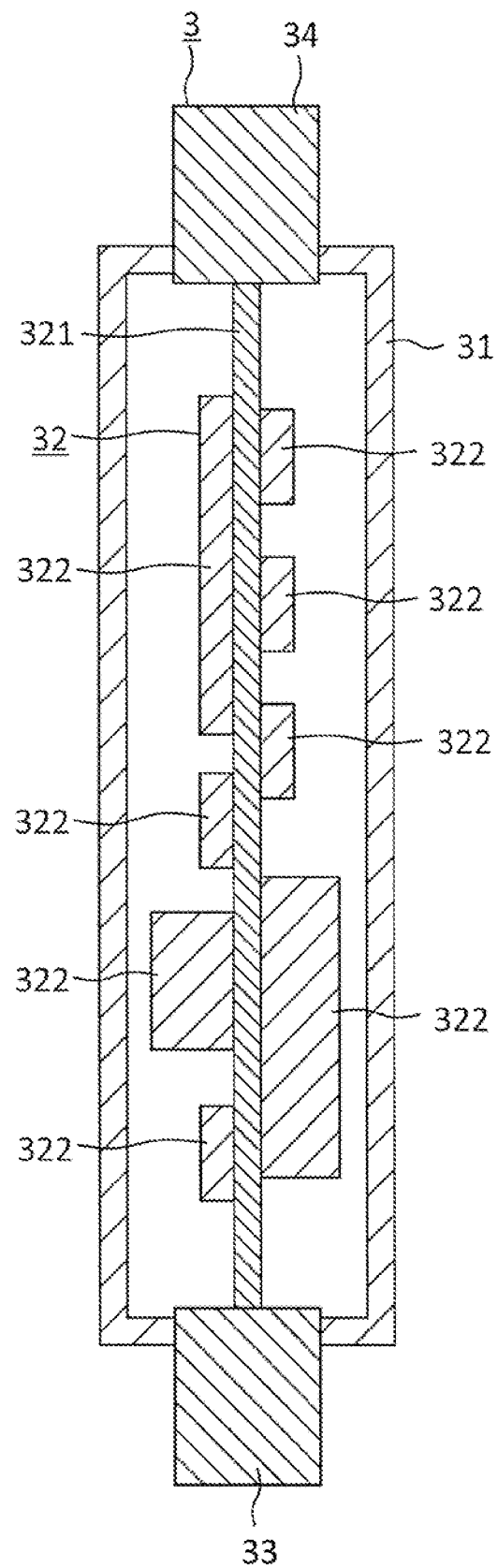
FIG. 2 is a sectional view of the electronic control device of FIG. 1.

FIG. 2 is a sectional view of the electronic control device 3 of FIG. 1. The electronic control device 3 includes an electronic control housing 31, an electronic circuit 32, a first connector 33, and a second connector 34.

The electronic circuit 32 is provided inside the electronic control housing 31. The electronic circuit 32 includes a plate-like circuit board 321, and a plurality of electronic control components 322 provided on both surfaces of the circuit board 321.

The first connector 33 is provided at one longitudinal end portion of the circuit board 321. The first connector 33 is fixed to the circuit board 321 and the electronic control housing 31. The first connector 33 is electrically connected to the electronic control components 322. The first connector 33 is a male connector. The first connector 33 is connectable to the inner connector 23.

The second connector 34 is provided at another longitudinal end portion of the circuit board 321. The second connector 34 is fixed to the circuit board 321 and the electronic control housing 31. The second connector 34 is electrically connected to the electronic control components 322. The second connector 34 is a male connector.

As illustrated in FIG. 1, the electronic device unit 1 further includes an outer connector 4 provided outside the control target housing 21, and a sealing member 5 configured to seal a gap between the control target housing 21 and the outer connector 4. The outer connector 4 is electrically connected to an external device (not shown). The outer connector 4 and the external device are connected to each other with use of a harness, for example. The outer connector 4 is a female connector. The second connector 34 is connectable to the outer connector 4.

With the second connector 34 connected to the outer connector 4, and the first connector 33 connected to the inner connector 23, the external device can operate the control target component 22 of the control target device 2 via the electronic control device 3.

When the first connector 33 is connected to the inner connector 23, and the second connector 34 is connected to the outer connector 4, the opening 24 is covered with the outer connector 4 from outside the control target housing 21, and the gap between the control target housing 21 and the outer connector 4 is sealed by the sealing member 5.

The outer connector 4 has a locking mechanism configured to lock connection between the second connector 34 and the outer connector 4. The sealing member 5 is mounted to the outer connector 4. The outer connector 4 is removably mounted to the control target housing 21. The inner connector 23 has no locking mechanism configured to lock the connection between the first connector 33 and the inner connector 23.

The electronic control device 3 can be placed in and taken out of the control target housing 21 of the control target device 2 through the opening 24. When the electronic control device 3 is mounted to the control target device 2, a peripheral edge portion of the electronic control device 3 is located on an inner side of an inner wall surface of the opening 24 as viewed in a direction in which the electronic control device 3 is placed in and taken out of the control target housing 21.

When the electronic control device 3 is placed in and taken out of the control target housing 21, a longitudinal direction of the circuit board 321 matches the direction in which the electronic control device 3 is placed in and taken out of the control target housing 21. When the first connector 33 is connected to the inner connector 23, the longitudinal direction of the circuit board 321 matches the direction in which the electronic control device 3 is placed in and taken out of the control target housing 21. When the first connector 33 is connected to the inner connector 23, at least a part of the electronic control device 3 is located inside the control target housing 21.

At the time when the control target device 2 is used, the outer connector 4 is fixed to the control target housing 21. With this, the gap between the control target housing 21 and the outer connector 4 is kept sealed by the sealing member 5, and the opening 24 is kept covered by the outer connector 4. As a method of fixing the outer connector 4 to the control target housing 21, for example, a fixing method using screws can be adopted.

As described above, according to the electronic device unit 1 of the first embodiment of the present invention, when the electronic control device 3 provided inside the control target housing 21 is to be replaced, the electronic control device 3 is replaced through the opening 24 without requiring to disassemble the control target device 2. Accordingly, the electronic control device 3 mounted to the control target device 2 can be easily replaced. Further, at least a part of the electronic control device 3 is located inside the control target housing 21. Thus, a space required to provide the electronic circuit 32 can be saved in an outer region of the control target device 2. Further, at least apart of the electronic control device 3 is provided inside the control target housing 21. With this, the electronic control device 3 is protected from being hit by any flying object from the outside and thus protected from any impact. Accordingly, reliability of the electronic device unit 1 can be enhanced.

Further, at the time of replacement of the electronic control device 3, the outer connector 4 is removed from the control target housing 21. The connection between the first connector 33 and the inner connector 23 is not locked, while the connection between the second connector 34 and the outer connector 4 is locked. Thus, concurrently with the removal of the outer connector 4 from the control target housing 21, the electronic control device 3 provided inside the control target housing 21 can be removed from the control target component 22.

Further, when the outer connector 4 is fixed to the control target housing 21, the opening 24 of the control target housing 21 is covered with the outer connector 4, and the gap between the outer connector 4 and the control target housing 21 is sealed by the sealing member 5. Therefore, when the outer connector 4 is fixed to the control target housing 21, intrusion of liquid, dust, or other foreign substance into the control target housing 21 is avoided.

Further, when the electronic control device 3 is mounted to the control target device 2, the peripheral edge portion of the electronic control device 3 is located on the inner side of the inner wall surface of the opening 24 as viewed in the direction in which the electronic control device 3 is placed in and taken out of the control target housing 21. With this, the electronic control device 3 can be easily placed in and taken out of the control target housing 21.

Second Embodiment

Figure 3:
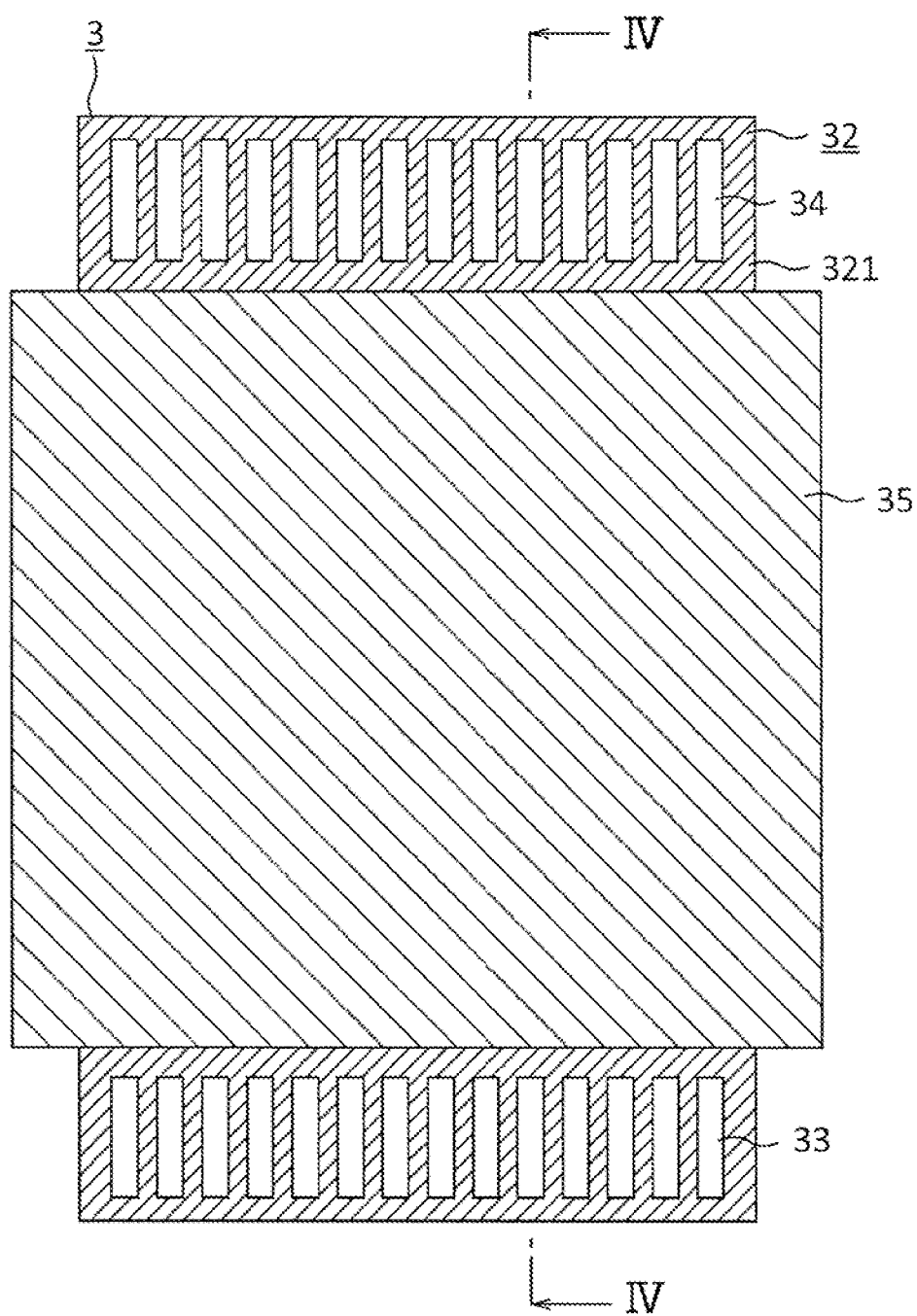
FIG. 3 is a plan view of an electronic control device of an electronic device unit according to a second embodiment of the present invention.
Figure 4:
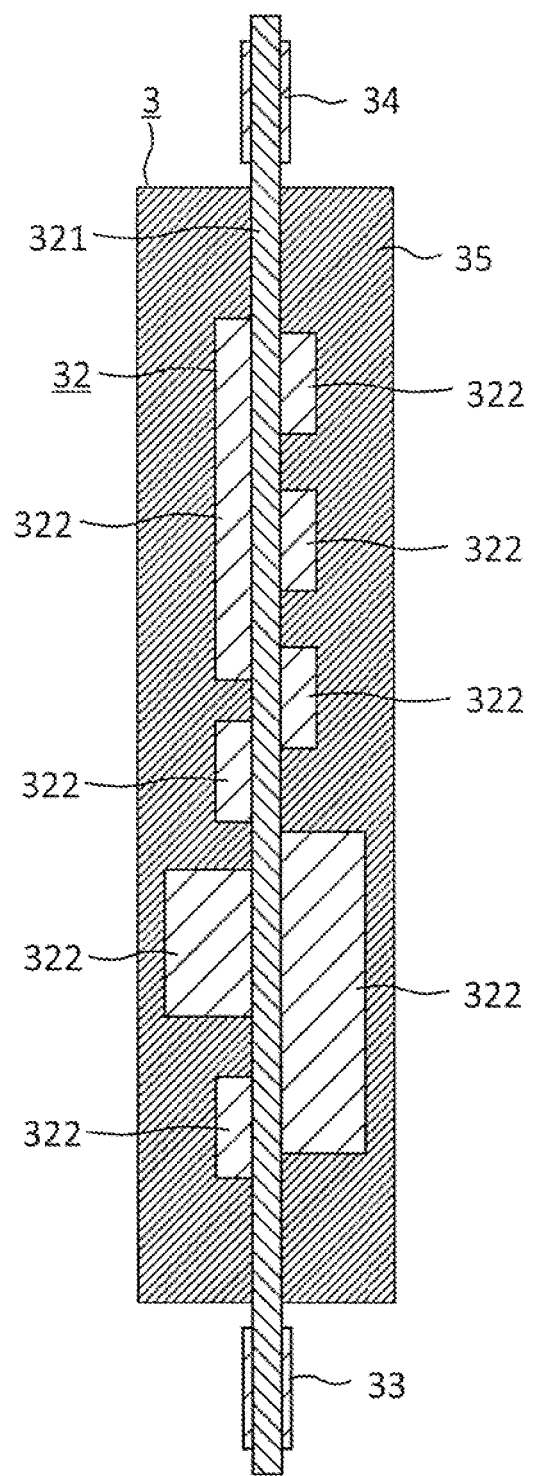
FIG. 4 is a sectional view taken along the line IV-IV of FIG. 3 as viewed in a direction indicated by the arrows.

FIG. 3 is a plan view of an electronic control device of an electronic device unit according to a second embodiment of the present invention. FIG. 4 is a sectional view taken along the line IV-IV of FIG. 3 as viewed in a direction indicated by the arrows. The electronic control device 3 further includes a resin portion 35, which covers the plurality of electronic control components 322. The resin portion 35 is fixed to the circuit board 321. In the second embodiment, the electronic control device 3 includes no electronic control housing 31. However, even when the electronic control device 3 is removed from the control target device 2, the electronic control components 322 are not exposed.

Each of the first connector 33 and the second connector 34 is a card edge connector formed of a conductor pattern formed on the circuit board 321. In this example, the conductor pattern forming the card edge connector is a copper foil pattern.

FIG. 5 is a plan view of the electronic control device 3 of FIG. 3, from which the resin portion 35 is removed. The circuit board 321 is divided into a first region 323 in which the plurality of electronic control components 322 are provided, and a second region 324 in which the first connector 33 and the second connector 34 are provided. The resin portion 35 is provided only in the first region 323.

The resin portion 35 is formed of a thermosetting resin. Examples of the thermosetting resin include an epoxy resin, a phenolic resin, a melamine resin, and a polyurethane resin. The resin portion 35 is formed on the circuit board 321 by transfer molding. With the resin portion 35 fixed to the circuit board 321, the electronic control components 322 are more firmly fixed to the circuit board 321. A solder connection portion (not shown) for electrically connecting between the electronic control components 322 and the circuit board 321 is fixed to the resin portion 35. Accordingly, thermal stress and vibration stress are less concentrated in the solder connection portion. Other configurations of the electronic device unit 1 are the same as those of the first embodiment.

As describe above, according to the electronic device unit 1 of the second embodiment of the present invention, each of the first connector 33 and the second connector 34 is a card edge connector formed of a conductor pattern formed on the circuit board 321. With this, each of the first connector 33 and the second connector 34 has the same thickness dimension as that of the circuit board 321. Therefore, as compared to the first embodiment, the thickness dimension of each of the first connector 33 and the second connector 34 can be reduced. Further, through the reduction of the thickness dimension of each of the first connector 33 and the second connector 34, a thickness dimension of each of the inner connector 23 and the outer connector 4 can be reduced as compared to the first embodiment. As a result, each of the inner connector 23 and the outer connector 4 can be reduced in weight.

The electronic control device 3 further includes the resin portion 35, which covers the electronic control components 322. In the first embodiment, a clearance of several millimeters is required between the electronic control housing 31 and the electronic control components 322 so as to avoid a collision between the electronic control housing 31 and the electronic control components 322. In contrast, in the second embodiment, the electronic control components 322 are covered with the resin portion 35. With this, a thickness dimension of a portion covering the electronic control components 322, of the resin portion 35 can be set to a minimum dimension that allows the thermosetting resin to flow during transfer molding. In this example, the thickness dimension of the thinnest portion in the portion covering the electronic control components 322, of the resin portion 35 is 0.5 mm. Thus, as compared to the electronic control device 3 in the first embodiment, the thickness dimension of the electronic control device 3 in the second embodiment can be reduced. Further, each of the first connector 33 and the second connector 34 is a card edge connector, and hence the thickness dimension of the electronic control device 3 in the second embodiment can be reduced as compared to the electronic control device 3 in the first embodiment.

Further, each of the first connector 33 and the second connector 34 is a card edge connector formed of a conductor pattern formed on the circuit board 321. In the first embodiment, assembly work is required for mounting of the first connector 33 and the second connector 34 to the circuit board 321. In contrast, in the second embodiment, the first connector 33 and the second connector 34 are formed at the time when the circuit board 321 is manufactured. With this, no assembly work is required for mounting of the first connector 33 and the second connector 34 to the circuit board 321. Consequently, a manufacturing cost of the electronic control device 3 can be saved.

Further, the resin portion 35 is formed of a thermosetting resin. Thus, as compared to a case of the resin portion 35 formed of a thermoplastic resin, the transfer molding can be performed at low temperature and low pressure. With this, heat and pressure applied to the electronic control components 322 during the transfer molding are reduced. As a result, dimension accuracy of an outer shape of the electronic control device 3 can be improved.

In the embodiments, the description is given of the electronic device unit 1 in which the sealing member 5 configured to seal the gap between the outer connector 4 and the control target housing 21 is fixed to the outer connector 4. However, the electronic device unit 1 may be configured such that the sealing member 5 is fixed to the control target housing 21. Further, the sealing member 5 may be separate from both the outer connector 4 and the control target housing 21. In this case, when the outer connector 4 is fixed to the control target housing 21, the sealing member 5 is interposed between the outer connector 4 and the control target housing 21.

Further, in the embodiments, the description is given of the control target device 2 in which the inner connector 23 is fixed to the control target component 22. However, the control target device 2 may be configured such that the inner connector 23 is fixed to any component other than the control target component 22. In this case, the inner connector 23 and the control target component 22 are electrically connected to each other via a harness. With this, each of the inner connector 23 and the control target component 22 can be provided at an optimum position.

Further, in the embodiments, the description is given of the electronic device unit 1 in which the inner connector 23 has no locking mechanism configured to lock the connection between the first connector 33 and the inner connector 23. However, the electronic device unit 1 may be configured such that the inner connector 23 has a locking mechanism configured to lock the connection between the first connector 33 and the inner connector 23. In this case, the locking mechanism of the inner connector 23 may be a snap fit mechanism. When the inner connector 23 has the locking mechanism, a locking force of the locking mechanism of the outer connector 4 is larger than that of the locking mechanism of the inner connector 23. With this, when the outer connector 4 is removed from the control target housing 21, the first connector 33 is removed from the inner connector 23. Thus, the electronic control device 3 is removed from the control target device 2 concurrently with the removal of the outer connector 4 from the control target housing 21.

Further, in the second embodiment, the description is given of the electronic control device 3 in which both the first connector 33 and the second connector 34 are card edge connectors. However, the electronic control device 3 may be configured such that any one of the first connector 33 and the second connector 34 is a card edge connector.

Further, in the second embodiment, the description is given of the electronic control device 3 in which the resin portion 35 is formed of a thermosetting resin. However, the electronic control device 3 may be configured such that the resin portion 35 is formed of a thermoplastic resin. The electronic control device 3 may also be configured such that the resin portion 35 is formed by potting.

Further, in the embodiments, the description is given of the electronic device unit 1 in which the first connector 33 is a male connector. However, the electronic device unit 1 maybe configured such that the first connector 33 is a female connector. In this case, the inner connector 23 is a male connector. Further, in the embodiments, the description is given of the electronic device unit 1 in which the second connector 34 is a male connector. However, the electronic device unit 1 may be configured such that the second connector 34 is a female connector. In this case, the outer connector 4 is a male connector.

Further, in the embodiments, the description is given of the configuration in which the opening 24 is formed in the upper wall of the control target housing 21. However, the present invention is not limited thereto, and another configuration may be adopted, in which the opening 24 is formed in a side wall of the control target housing 21, for example. In this case as well, the electronic control device 3 can be placed in and taken out of the control target housing 21 of the control target device 2 through the opening 24.

Further, in the embodiments, the description is given of the configuration in which, when the electronic control device 3 is placed in and taken out of the control target housing 21, the longitudinal direction of the circuit board 321 matches the direction in which the electronic control device 3 is placed in and taken out of the control target housing 21. However, the present invention is not limited thereto, and another configuration may be adopted, in which, when the electronic control device 3 is placed in and taken out of the control target housing 21, a transverse direction of the circuit board 321 matches the direction in which the electronic control device 3 is placed in and taken out of the control target housing 21. Further, another configuration may be adopted, in which, when the first connector 33 is connected to the inner connector 23, the transverse direction of the circuit board 321 matches the direction in which the electronic control device 3 is placed in and taken out of the control target housing 21 as in the above-mentioned configuration.

What is claimed is:

1. An electronic device unit comprising:
    a control target device including:
       a control target housing,
       a control target component provided inside the control target housing, and
       an inner connector, which is provided inside the control target housing and is electrically connected to the control target component;
    an electronic control device to be mounted to the control target device, the electronic control device including:
       an electronic circuit including a circuit board and an electronic control component mounted to the circuit board, and
       a first connector, which is fixed to the circuit board, and is electrically connected to the electronic control component;
    an outer connector provided outside the control target housing; and
    a sealing member configured to seal a gap between the control target housing and the outer connector,
    wherein the control target housing has formed therein an opening, which allows the electronic control device to be placed in and taken out of the control target housing,
    wherein, when the first connector is connected to the inner connector, at least a part of the electronic control device is located inside the control target housing, and
    wherein the electronic control device further includes a second connector, which is fixed to the circuit board, and is electrically connected to the electronic control component, and
    wherein, when the first connector is connected to the inner connector, and the second connector is connected to the outer connector, the opening is covered with the outer connector from outside the control target housing, and the gap between the control target housing and the outer connector is sealed by the sealing member.

2. The electronic device unit according to claim 1, wherein the outer connector has a locking mechanism configured to lock connection between the second connector and the outer connector.

3. The electronic device unit according to claim 1, wherein at least one of the first connector or the second connector includes a card edge connector formed of a conductor pattern formed on the circuit board.

4. The electronic device unit according to claim 1, wherein, when the electronic control device is mounted to the control target device, a peripheral edge portion of the electronic control device is located on an inner side of an inner wall surface of the opening as viewed in a direction in which the electronic control device is placed in and taken out of the control target housing.

5. The electronic device unit according to claim 1, wherein the electronic control device further includes a resin portion, which covers the electronic control component.

6. The electronic device unit according to claim 5, wherein the resin portion is formed of a thermosetting resin.

* * * * *